(12) United States Patent
Capasso et al.

(10) Patent No.: US 6,324,199 B1
(45) Date of Patent: Nov. 27, 2001

(54) INTERSUBBAND LIGHT SOURCE WITH SEPARATE ELECTRON INJECTOR AND REFLECTOR/EXTRACTOR

(75) Inventors: Federico Capasso, Westfield; Alfred Yi Cho, Summit; Sung-Nee George Chu, Murray Hill; Claire F. Gmachl, Millburn; Albert Lee Hutchinson, Piscataway; Deborah Lee Sivco, Warren; Alessandro Tredicucci, Summit, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/195,260

(22) Filed: Nov. 18, 1998

(51) Int. Cl.$^7$ ........................................................ H01S 5/00
(52) U.S. Cl. ................................ 372/45; 372/43; 372/44; 372/46; 372/47; 372/48; 372/50
(58) Field of Search ................................. 372/43, 44, 45, 372/46, 47, 48, 50

(56) References Cited

U.S. PATENT DOCUMENTS

| | | | |
|---|---|---|---|
| 5,457,709 | * 10/1995 | Capasso et al. | 372/45 |
| 5,509,025 | * 4/1996 | Capasso et al. | 372/45 |
| 5,570,386 | * 10/1996 | Capasso et al. | 372/46 |
| 5,936,989 | * 8/1999 | Capasso et al. | 372/45 |
| 5,978,397 | * 11/1999 | Capasso et al. | 372/45 |

OTHER PUBLICATIONS

Hsu et al., *Intersubband laser design using a quantum box array*, SPIE, vol. 3001, pp. 271–281 (1997).
R. F. Kazarinov et al., *Possibility of the Amplification . . .*, Soviet Phys.–Semic., vol. 5, No. 4, pp. 707–709 (1971).
W. M. Yee et al., *Carrier transport . . .*, Appl. Phys. Lett., vol. 63, No. 8, pp. 1089–1091 (1993).
J. Faist et al., *Phonon limited . . .*, Appl. Phys. Lett., vol. 64, No. 7, pp. 872–874 (1994).
J. Faist et al., *Quantum Cascade Laser*, Science, vol. 264, pp. 553–556 (1994).
J. Faist et al., *Vertical transition . . .*, Appl. Phys. Lett., vol. 66, No. 5, pp. 538–540 (1995).
C. Sirtori et al., *Quantum cascade . . .*, Appl. Phys. Lett., vol. 66, No. 24, pp. 3242–3244 (1995).
F. Capasso et al., *Infrared . . .*, Solid State Comm., vol. 102, No. 2–3, pp. 231–236 (1997).
G. Scamarcio et al., *High–Power . . .*, Science, vol. 276, pp. 773–776 (1997).
J. Faist et al., *High–Power . . .*, IEEE J. Quantum Electr., vol. 34, No. 2, pp. 336–343 (Feb. 1998).
J. Faist et al., *Short wavelength . . .*, Appl. Phys. Lett., vol. 72, No. 6, pp. 680–682 (Feb. 1998).
Y. B. Li et al., *Mid–infrared . . .*, Appl. Phys. Lett., vol. 72, No. 17, pp. 2141–2143 (Apr. 1998).
C. Gmachl et al., *High–power . . .*, Appl. Phys. Lett., vol. 72, No. 24, pp. 3130–3132 (Jun. 1998).

* cited by examiner

*Primary Examiner*—Teresa M. Arroyo
*Assistant Examiner*—Cornelius H. Jackson
(74) *Attorney, Agent, or Firm*—Michael J. Urbano

(57) ABSTRACT

An intersubband semiconductor light source comprises a core region that includes a unipolar, radiative transition (RT) region having upper and lower energy levels, an injector-only (I) region disposed on one side of the RT region, and a reflector/extractor-only (R/E) region disposed on the other side of the RT region. The I region has a first miniband of energy levels aligned so as to inject electrons into the upper energy level, and the R/E region has a second miniband of energy levels aligned so as to extract electrons from the lower energy level. The R/E region also has a minigap aligned so as to inhibit the extraction of electrons from the upper level. A suitable voltage applied across the core region is effective to cause the RT region to generate light at a wavelength determined by the energy difference between the upper and lower energy levels. Low voltage operation at less than 3 V is described.

13 Claims, 3 Drawing Sheets

INTERSUBBAND LIGHT SOURCE WITH SEPARATE ELECTRON INJECTOR AND REFLECTOR/EXTRACTOR

GOVERNMENT CONTRACTS

This invention was made with Government support under Contract Nos. DAAH04-96-C-0026 and DAAG55-98-C-0050 both awarded by the DARPA/US Army Research Office. The Government has certain rights in this invention.

FIELD OF THE INVENTION

This invention relates generally to intersubband semiconductor light sources, and, more particularly, to both incoherent, spontaneous emission intersubband sources (akin to LEDs) and coherent, stimulated emission intersubband sources (e.g., lasers).

BACKGROUND OF THE INVENTION

As described by F. Capasso et al. in *Solid State Communications*, Vol. 102, No. 2–3, pp. 231–236 (1997) and by J. Faist et al. in *Science*, Vol. 264, pp. 553–556 (1994), which are incorporated herein by reference, a QC laser is based on intersubband transitions between excited states of coupled quantum wells and on resonant tunneling as the pumping mechanism. Unlike all other semiconductor lasers (e.g., diode lasers), the wavelength of the lasing emission of a QC laser is essentially determined by quantum confinement; i.e., by the thickness of the layers of the active region rather than by the bandgap of the active region material. As such it can be tailored over a very wide range using the same semiconductor material. For example, QC lasers with AlInAs/GaInAs active regions have operated at mid-infrared wavelengths in the 3 to 13 $\mu$m range. In diode lasers, in contrast, the bandgap of the active region is the main factor in determining the lasing wavelength. Thus, to obtain lasing operation at comparable infrared wavelengths the prior art has largely resorted to the more temperature sensitive and more difficult-to-process lead salt materials system.

More specifically, diode lasers, including quantum well lasers, rely on transitions between energy bands in which conduction band electrons and valence band holes, injected into the active region through a forward-biased p-n junction, radiatively recombine across the bandgap. Thus, as noted above, the bandgap essentially determines the lasing wavelength. In contrast, the QC laser relies on only one type of carrier; i.e., it is a unipolar semiconductor laser in which distinct electronic transitions between conduction band states occur; these states arise from size quantization in the active region heterostructure.

The active region of QC lasers includes a multiplicity N (typically ~25) of stacked stages or repeat units, each unit including a radiative transition (RT) region adjacent an injection/relaxation (I/R) region. As the name of the laser implies, electrons cascade from one RT region to the next when a suitable bias voltage is applied across the device. This scheme leads to a slope efficiency (and external differential quantum efficiency) and laser power proportional to N in the linear part of the L-I characteristic, as confirmed by J. Faist et al., *IEEE J. Quantum Electron.*, Vol. 34, No. 2, pp. 336–343 (Feb. 14, 1998) and C. Gmachl et al., *Appl. Phys. Lett.*, Vol. 72, No. 24, pp.3130–3132 (Jun. 15, 1998), both of which are incorporated herein by reference. The N stages, which form a common active waveguide core, also increase the optical confinement and, therefore, the modal gain sufficiently to overcome the increased waveguide losses at mid-infrared (e.g., 3–13 $\mu$m) wavelengths, especially when N is large (e.g., $\geq$10). In fact, early theoretical work of Yee et al., *Appl. Phys. Lett.*, Vol. 63, No. 8, pp. 1089–1091 (1993) on GaAs/AlGaAs lasers reached the conclusion that a single intersubband transition (in a device having only a single RT region) would not have enough gain in the mid-infrared to reach the lasing threshold. Indeed, the high performance of many QC lasers has heretofore reinforced the notion that a cascaded structure is essential for an intersubband laser.

Thus, a need remains for a unipolar, intersubband semiconductor light source, especially a laser, that is capable of efficient emission at a single intersubband transition in a device having a single RT region.

In addition, the tendency for prior art QC lasers to have a relatively large number of stages (e.g., 25, as noted above) has both processing and operational implications. From a fabrication standpoint a large number of stages means a corresponding large number of relatively thin layers (e.g., 400) have to be epitaxially grown, which in turn requires careful control of the growth process (as to layer thickness, composition and strain compensation). On the other hand, from an operational perspective, a large number of stages typically requires a higher voltage bias (e.g., 6–10 V). Yet, some applications require an optical source which is capable of operation at lower voltages (e.g., <3 V).

Therefore, there is also a need for a unipolar, intersubband semiconductor light source that operates at relatively low voltages.

There is likewise a need for such a light source that has fewer layers and, therefore, is simpler to fabricate.

SUMMARY OF THE INVENTION

In accordance with one aspect of our invention, an intersubband semiconductor light source comprises a core region that includes a unipolar radiative transition (RT) region having upper and lower energy levels, an injector-only (I) region disposed on one side of the RT region, and a reflector/extractor-only (R/E) region disposed on the other side of the RT region. The I region has a first miniband of energy levels aligned so as to inject electrons into the upper energy level, and the R/E region has a second miniband of energy levels aligned so as to extract electrons from the lower energy level. The R/E region also has a minigap aligned so as to inhibit the extraction of electrons from the upper level. A suitable voltage applied across the core region is effective to cause the RT region to generate light at a wavelength determined by the energy difference between the upper and lower energy levels.

Our invention has several advantages. First, by designing the source so that the electron injector and reflector/extractor are located in separate regions, we are able to independently optimize their functions. Second, our invention can be fabricated using many fewer layers than typical QC lasers, which simplifies processing. Third, since our light source is capable of operating with a relatively small number of RT regions, it can also operate at relatively low voltages (e.g., <3 V).

In an alternative embodiment of our invention, the source includes at least two RT regions separated by an injection/relaxation region The I region is disposed adjacent one of the RT regions, and the R/E region is adjacent another of the RT regions. This embodiment also exploits the separate optimization of the I and R/E regions, but in addition contemplates the use of several RT regions to increase the output while retaining the ability to operate at relatively low voltages.

BRIEF DESCRIPTION OF THE DRAWING

Our invention, together with its various features and advantages, can be readily understood from the following more detailed description taken in conjunction with the accompanying drawing, in which.

0.5/5.0/0.8/4.8/0.9/4.4/1.0/4.0/1.1/3.6/1.2/3.2/1.2/3.0/1.6/
3.0/3.8/2.1/1.2/6.5/1.2/5.3/2.3/4.0/1.1/3.6/1.2/3.2/1.2/
3.0/1.6/3.0/1.0.

Figure 1:
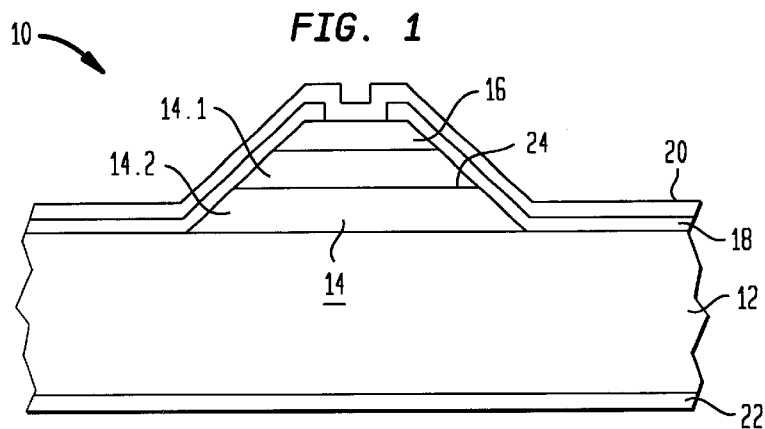
FIG. 1 is a schematic, cross-sectional view of a QC light source/emitter in accordance with one embodiment of our invention.
Figure 2:
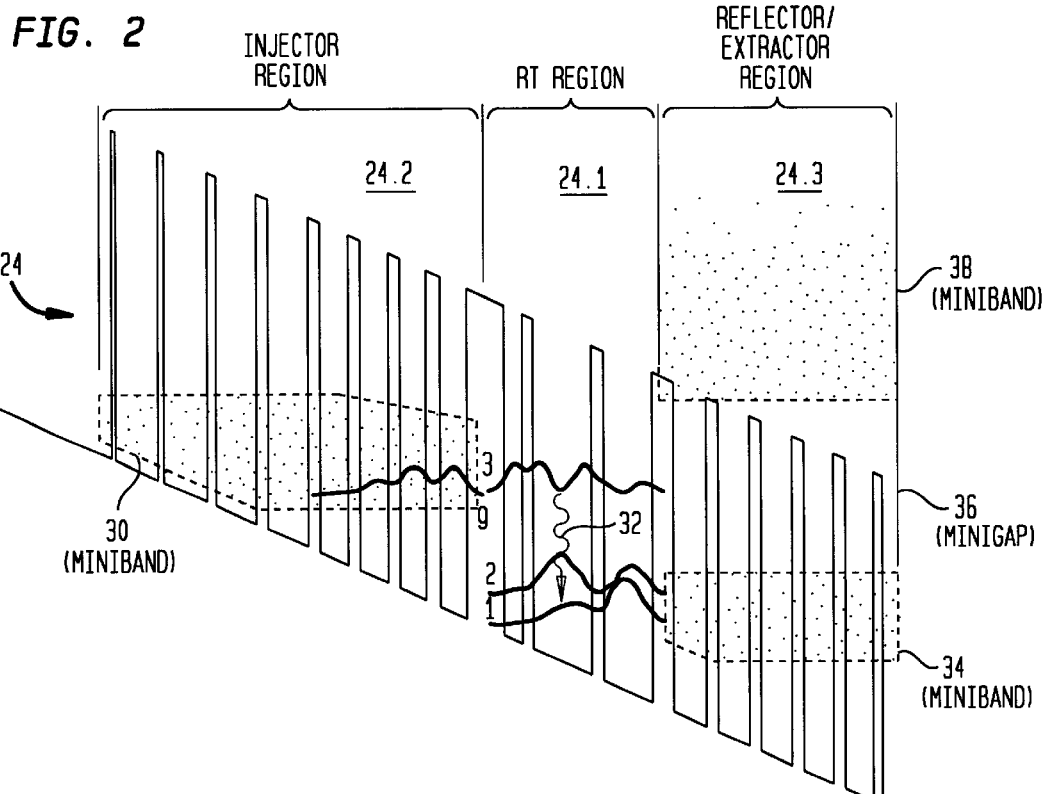
FIG. 2 shows a conduction band profile of a single RT region with the adjacent I and R/E regions at a design electric field of 65 kV/cm corresponding to the lasing threshold. The shaded regions 30, 34 and 38 indicate the energy and spatial extension of the manifold of miniband-like states. The moduli squared of the wavefunctions of four relevant energy levels ( 3, 2, 1 and g) and the corresponding radiative transition (wavy arrow 32) are also shown. In one embodiment, the actual layer thicknesses in nanometers were ( from top to bottom, starting from the first semiconductor layer)
Figure 3:
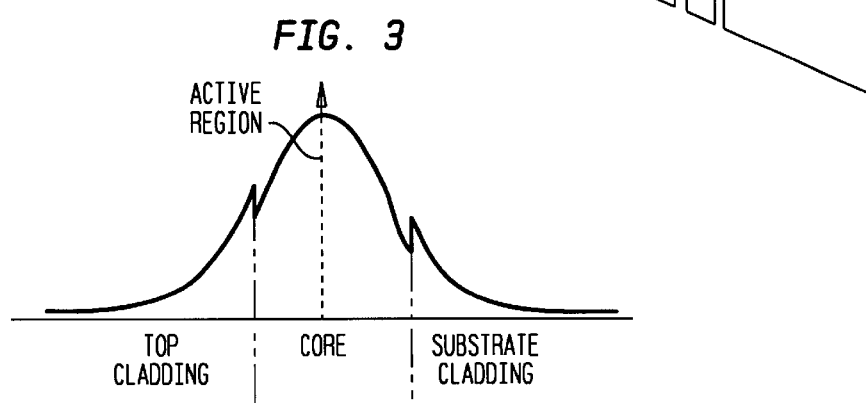
Figure 4:
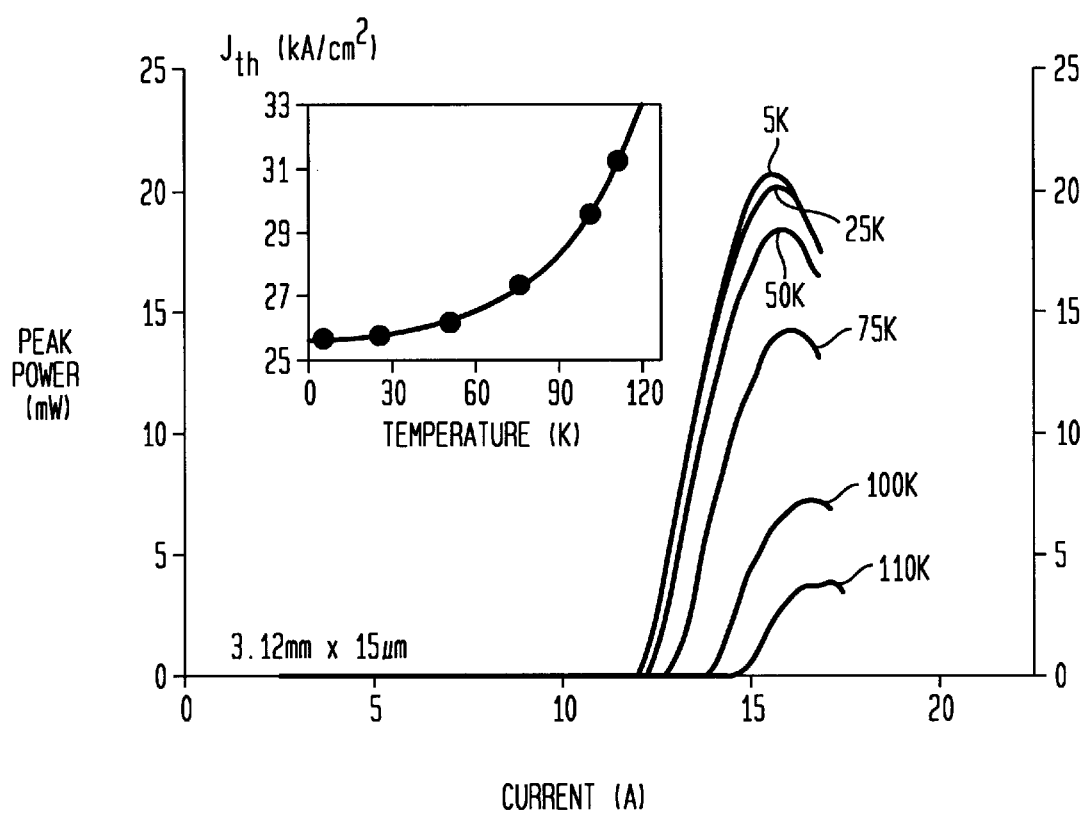
Figure 5:
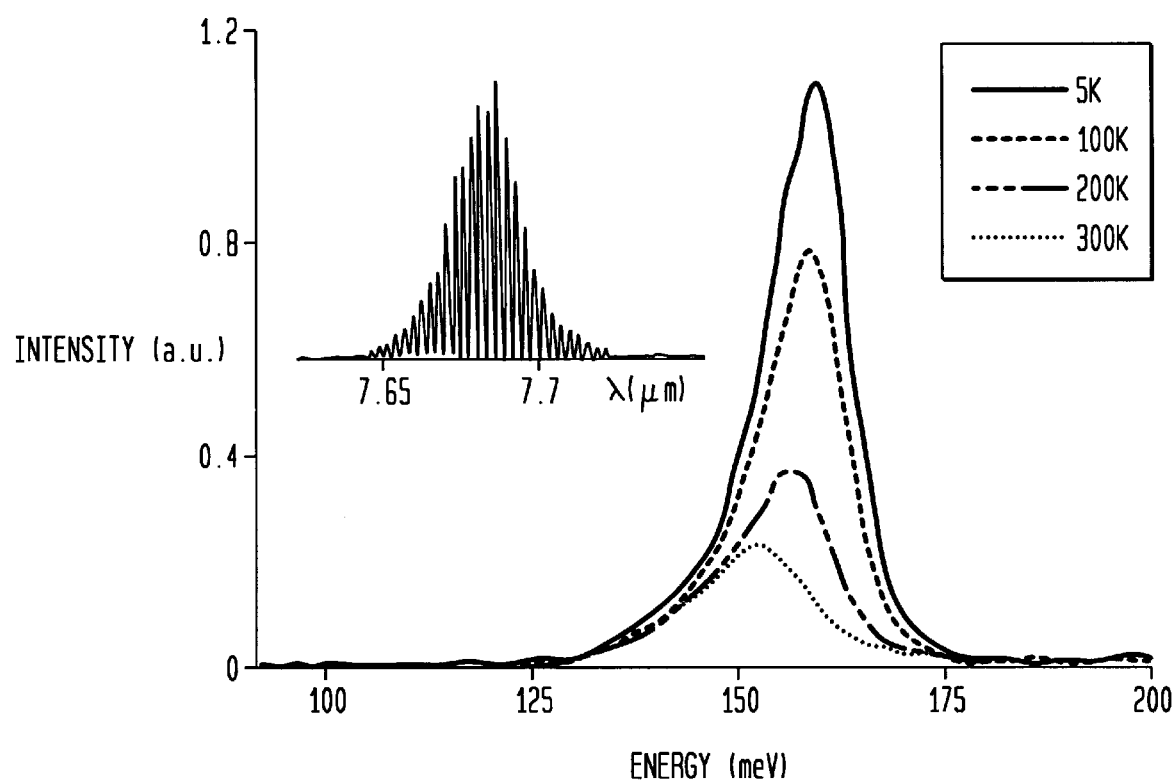
Figure 6:
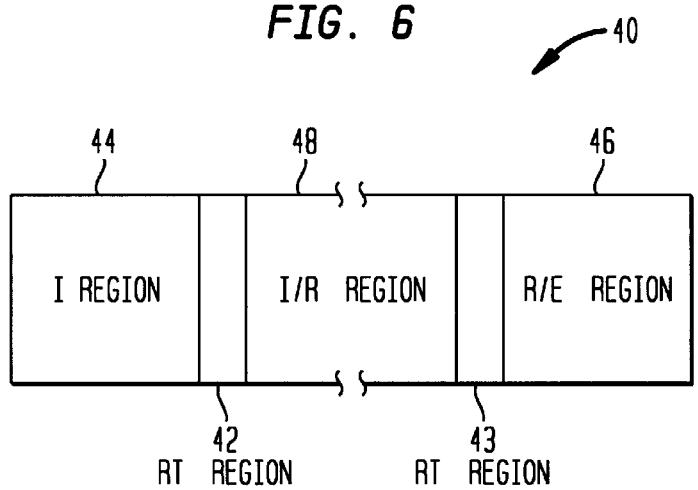

The bold-face layers were Si-doped to about $2.5 \times 10^{17}$ cm$^{-3}$; the underlined layers contained the electron states directly involved in the radiative transition designated by wavy arrow 32. The thicknesses listed above are broken into two lines for convenience only, it being understood that the list is intended to be continuous (i.e., the layer at the end of the first line is physically adjacent the layer at the beginning of the second line);

FIG. 3 shows the intensity profile of the fundamental waveguide mode in one embodiment of the source/emitter depicted in FIGS. 1 and 2 when operated as a laser;

FIG. 4 shows the light-current (L-I) characteristics at various heat sink temperatures of a deep-etched, ridge waveguide laser (3.12 mm long, 15 $\mu$m wide) driven in pulsed mode, in accordance with one embodiment of our invention. The light was collected with approximately 60% collection efficiency from one output facet of the laser. The applied voltage at laser threshold was ~2.5 V. The inset depicts the threshold current density ($J_{th}$) as a function of the heat sink temperature for the laser shown in the main graph. The data were fitted with an exponential function, $J_{th}=J_1 \exp(T/T_1)+J_0$;

FIG. 5 shows the electroluminescence measured at various heat sink temperatures of a spontaneous emission device in accordance with another embodiment of our invention. This device was deep-etched, circular mesa (approximately 120 $\mu$m in diameter) processed from the same wafer (and wafer area) as the lasers described above. The pulsed current density was kept essentially constant at about 26.5 kAcm$^{-2}$, and the pulse width was chosen so that the average dissipated power was not the dominating factor affecting the linewidth. The inset depicts the emission spectrum of a 3.12 mm long laser device at 10 K; and FIG. 6 schematically shows an active region having multiple RT regions, in accordance with another embodiment of our invention.

In the interest of clarity and simplicity, the FIGS. 1–3 and 6 have not been drawn to scale. In addition, when describing physical or optical dimensions, the symbol A stands for Angstroms, whereas when describing electric current, it stands for Amperes.

DETAILED DESCRIPTION OF THE INVENTION

General Structure

With reference now to FIG. 1, an intersubband semiconductor light emitter/source 10 comprises a core region 14 sandwiched between an upper cladding region 16 and a substrate 12 which serves as a lower cladding region. The core region includes a thin active region 24 sandwiched between a pair of regions 14.1 and 14.2, each having a refractive index that is high relative to that of the cladding regions. Alternatively, a lower cladding region, separate from the substrate, may be formed between the substrate and the active region. The upper cladding region 16 is illustratively formed in the shape of a mesa or trapezoid typical of ridge waveguide laser structures. The mesa may be shallow-etched so as to stop at the top of the active region 24, or, as shown, it may be deep-etched so that the mesa extends through the active region. In either case, an electrically insulating layer 18 (e.g., Si$_3$N$_4$ or SiO$_2$) is formed over the top of the device and is patterned to form an opening which exposes a portion of the top of the mesa. A first electrode 20 is formed over the insulating layer 18 and in the opening so as to contact the upper cladding region (usually by means of a highly doped contact-facilitating layer, not shown), and a second electrode 22 is formed on the substrate 12.

The substrate itself may be a single crystal semiconductor body or a combination of such a body with another layer (e.g., an epitaxial layer grown on the top surface of the body). Illustratively, light emitters of this type are fabricated from Group Ill–V compound semiconductors; e.g., In-based Group Ill–V compounds such as GaInAs and AlInAs.

Drive circuitry, not shown, is coupled across the electrodes in order to provide an external voltage bias and to supply pumping energy (e.g., electric current) to the device of sufficient magnitude to generate light. Below threshold the emitter operates as an incoherent, spontaneous emission source, whereas above threshold it operates as a coherent, stimulated emission source. In the latter case, when provided with optical feedback, the source functions as laser. Suitable optical feedback is typically provided by an optical cavity resonator formed, for example, by cleaved crystal facets, distributed feedback (DFB)gratings, distributed Bragg reflectors (DBRs), or a combination of them.

In some designs of a spontaneous emission source in accordance with our invention, the cladding regions may be omitted, especially if they absorb light at the operating wavelength of the device.

Active Region

The unipolar active region 24 of FIG. 1, as noted above, is disposed between high refractive index regions 14.1 and 14.2. The three regions, therefore, form the core of an optical waveguide that is sandwiched between upper and lower cladding regions 16 and 12, respectively. The intensity profile of the fundamental mode of the light generated in the active region of a laser of the type depicted in FIG. 2 is shown in FIG. 3. The active region itself, as shown in the illustrative embodiment of FIG. 2, includes at least one radiative transition (RT) region 24. 1, an injector-only (I) region 24.2 disposed on the upstream side of the RT region, and a reflector/extractor-only (R/E) region 24.3 disposed on the downstream side of the RT region. The frame of reference for the terms upstream and downstream is the direction of electron flow, which is from left to right in FIG. 2. The RT region includes a plurality of coupled quantum well (QW) regions interleaved with barrier regions. The QWs are coupled in the sense that their wavefunctions extend across substantially the entire RT region. Illustratively, the RT region includes only three QW regions and two interleaved barrier regions. However, the number of QW and barrier regions is a matter of design choice, keeping in mind that more active regions imply, in general, higher voltage operation.

These wavefunctions, designated 3, 2 and 1 are shown in FIG. 2 along with a wavy arrow 32 that designates a radiative transition of electrons from the upper level 3 to the lower level 2. The upper level 3 is populated by injection of electrons from the bottom of the miniband 30 of I region 24.2 (e.g., from ground state g). In contrast, electrons in the lower level 2 relax to lower level 1, but both of these levels are depopulated by transport into the lower miniband 34 of R/E region 24.3. In addition, R/E region 24.3 includes a minigap 36, between upper miniband 38 and lower miniband 34, that is aligned with the upper level 3 so as to prevent any substantial depopulation of that level by tunneling into the R/E region. In this sense the R/E region 24.3 functions as an electron reflector. Preferably, upper level 3 is centrally positioned with respect to the minigap. If the upper level were too close to either upper miniband 38 or lower miniband 34, then many electrons in upper level 3 would undergo transport to the closer miniband rather than undergo radiative (optical) transitions to the lower level 2. The combination of these features ensures a population inversion between the upper level 3 and the lower level 2. In addition, unlike the injection/relaxation (I/R) regions of typical QC lasers, the injector-only I region 24.2 performs an electron injection function but does not perform a relaxation function, and conversely, the reflector/extractor R/E region 24.3 performs a reflection/extraction function but does not perform an injection function. The separation of these functions enables the I region and the R/E region to be independently optimized.

In a preferred embodiment, the thicknesses of at least a first subset of the QW layers of the I region decrease from layer to layer in the direction of electron flow; i.e., toward the RT region. This feature increases the energy of electrons in the I region with respect to the QW material's band edge until the electron energy is approximately at the energy of upper level 3. Stated another way, as the thicknesses of the QW layers decrease, the energy of the quantum states in the corresponding QWs increases, until, in the QW closest to the RT region, it is resonant with the upper level 3. In addition, when the thicknesses of the QW layers are so varied, it is also advantageous that the thicknesses of at least a second subset of the barrier layers be increased from layer to layer in the direction of electron flow. The first and second subsets need not, and often are not, identical to one another.

The terms miniband and minigap are understood in the following context. The I region 24.2 and the E/R region 24.3 are essentially superlattices (SLs); i.e., periodic stacks of alternating thin (e.g., nanometer thick) layers of two different semiconductor materials having different bandgaps (i.e., lower bandgap quantum well (QW) layers interleaved with wider bandgap barrier layers). As described by G. Scamarcio et al., *Science,* Vol. 276, pp. 773–776 (May 1997), and incorporated herein by reference, the period of this structure (~5 nm) is typically much larger than the lattice constant of the bulk crystalline constituents (~0.5 nm). This superimposed potential splits the conduction and valence bands into a series of much narrower bands (typically tens to a few hundred millielectron volts wide in the strong tunnel-coupling regime) called minibands, which are separated by energy gaps (minigaps) along the direction perpendicular to the layers. To form a miniband requires that the wavefunctions of the states in each of the QWs are delocalized; i.e., the wavefunctions extend over many QWs, thus indicating that the QWs are strongly coupled to one another; they are not localized in which case the QWs would be effectively decoupled from one another.

Alternative Embodiment

As was suggested in the embodiment of FIGS. 1 and. 2, the active region 14 includes at least one RT region. FIG. 6 shows an embodiment of our intersubband laser 40 which includes at least two RT regions. Unlike typical QC lasers, RT region 42 is disposed adjacent I region 44, and RT region 43 is disposed adjacent R/E region 46. On the other hand, in a fashion similar to typical QC lasers the two RT regions are separated from one another by an injection/relaxation I/R region 48. The broken line in the central section of I/R region 48 signifies that, in principle, one or more RT regions (likewise separated by I/R regions) could be included in this section. The latter inclusion, however, would not alter the underlying need for separated I and E/R regions in accordance with our invention.

EXAMPLE

This example describes a Group III–V compound semiconductor, non-cascaded. intersubband laser in accordance with one embodiment of our invention. Various materials, dimensions and operating conditions are provided by way of illustration only and, unless otherwise expressly stated, are not intended to limit the scope of the invention. As used herein, the term undoped means that a particular semiconductor layer or region is not intentionally doped; i.e., any doping of such a region or layer is relatively low and typically results from residual or background doping in the chamber used to grow the layers of the device.

The structure, of the type shown in FIGS. 1 and 2, was grown in the GaInAs/AlInAs material system lattice matched to InP using molecular beam epitaxy. The RT region 24.1 was embedded between an injector-only (I) region 24.2 and a reflector/extractor-only (R/E) region 24.3. The I region was a SL designed to inject electrons into the upper laser level 3 under an appropriate applied voltage bias. The E/R region was an SL-like structure but had only a five-quantum-well "SL" designed to prevent carriers from tunneling out of the upper laser level 3 and, simultaneously, to efficiently extract them from the lower laser level 2 and ground state 1. The RT region comprised three GaInAs quantum wells closely coupled by thin AlInAs barriers. At the design electric field of 65 kV/cm, approximately corresponding to the lasing threshold, the upper laser level 3 was separated from the lower laser level 2 by $E_{32}=160$ meV ($\lambda=7.75\,\mu m$). The electron-longitudinal optical (LO) phonon scattering time $\tau_{32}$ between the two levels was calculated as 3.3 ps and the matrix element of the optical transition was $z_{32}=19.5$ nm. Level 1 was separated in energy from level 2 by approximately one LO-phonon. The corresponding lifetime was calculated as $\tau_2 \approx \tau_{21}=0.5$ ps$<<\tau_{32}=3.3$ ps, such that population inversion between levels 3 and 2 was readily achieved The electron-LO phonon scattering time from level 3 to level 1 was estimated as $\tau_{31}=3.5$ ps. The I region was modulation doped in its center portion with an electron sheet density of $n=2\times10^{11}$ cm$^{-2}$; i.e., the doping was localized in several layers that were separated from the RT region by undoped layers.

The active region 24 was embedded in a waveguide core 14 formed by low doped (Si: $n=3\times10^{16}$ cm$^{-3}$) GaInAs layers 14.2 and 14.1 of thickness 1.15 $\mu m$ and 0.9 $\mu m$ below and above the active region, respectively. The lower waveguide cladding layer was formed by the low doped ($n\approx2\times10^{17}$ cm$^{-3}$) InP-substrate. An inner, low-doped AlInAs layer (including a 1.5 $\mu m$ thick layer doped $n=1\times10^{17}$ cm$^{-3}$ followed by an 0.8 $\mu m$ thick layer doped $n=2\times10^{17}$ cm$^{-3}$) and an outer, highly doped GaInAs layer (0.8 $\mu m$ thick, $n=5\times10^{18}$ cm$^{-3}$), designed for plasmon-enhanced confinement, formed the upper waveguide cladding. This type of confinement is described by C. Sirtori et al, *Appl. Phys. Lett.,* Vol. 66, No. 24, pp. 3242–3244 (1995), which is incorporated herein by reference. The doping level in each layer was kept as low as possible to reduce free-carrier absorption. The waveguide loss was estimated as $\alpha_w \approx 21$ cm$^{-1}$ by applying the well known Hakki-Paoli method to sub-threshold spectra measured from a quantum cascade laser sample with a very similar waveguide and a cascade of three active regions.

From the values of $\tau_2$, $\tau_{31}$, $\tau_{32}$, and $z_{32}$ and the measured value of the luminescence linewidth (~12 meV, at the threshold current density) we calculated the gain coefficient g (assuming unity injection efficiency into level 3). This resulted in g≈132 cm/kA for the thickness of the RT region as depicted in FIG. 2 and in Table II, below. The confinement factor Γ, defined as the overlap of the mode intensity profile with the active region, was about 0.75%. The corresponding modal gain coefficient g·Γ was about 1 cm/kA. For an as-cleaved device (length L=3.12 mm; facet reflectivity R≈0.29) we calculated a mirror loss of $\alpha_m = -\ln(R)/L \approx 4$ cm$^{-1}$. These values allowed us to estimate the threshold current density $J_{th} = (\alpha_m + \alpha_w)/(g \cdot \Gamma)$ as $J_{th} \approx 25$ kAcm$^{-2}$.

The lasers from a sample/wafer designated D2442 were processed as conventional deep-etched, ridge waveguide lasers with stripe widths ranging from about 11 μm to 17 μm, measured at the location of the active region. The lasers were cleaved into bars with a length~3 mm, and the facets were left uncoated. The composition of sample D2442 is shown in Table I.

TABLE I

| Laser Structure D2442 | Composition | Doping Concentration (cm$^{-3}$) | Thickness (Å) |
|---|---|---|---|
| Contact-facilitating | GaInAs | n = 1 × 10$^{20}$ | 100 |
| Cladding | GaInAs | n = 5 × 10$^{18}$ | 8000 |
| Cladding | Digitally Graded V | n = 2 × 10$^{17}$ | 300 |
| Cladding | AlInAs | n = 2 × 10$^{17}$ | 8000 |
| Cladding | AlInAs | n = 1 × 10$^{17}$ | 15000 |
|  | Digitally Graded IV | n = 5 × 10$^{16}$ | 300 |
| Core | GaInAs | n = 3 × 10$^{16}$ | 9000 |
| Core | Active Region | Table II | 846 |
| Core | GaInAs | n = 3 × 10$^{16}$ | 11500 |
|  | Digitally Graded I | n = 3 × 10$^{16}$–1 × 10$^{17}$ | 250 |
| Substrate | InP | n = 1–4 × 10$^{17}$ | — |

The digitally graded (DG) regions I, IV and V comprised multi-layered structures of alternating GaInAs and AlInAs layers well known in the art. DG regions IV and V were uniformly doped from layer to layer, but in DG region I the top three layers were doped at 3×10$^{16}$ cm$^{-3}$, the middle four layers were doped at 5×10$^{16}$ cm$^{-3}$, and the bottom three layers were doped at 1×10$^{17}$ cm$^{-3}$. Non-uniform doping of DG region I, however, is not essential. As with the composition grading of the DG regions, it served to make a gradual transition between bulk-like material regions (i.e., between the substrate and the lowest GaInAs layer). Si was the impurity in all of the doped layers except the contact-facilitating layer which was doped with Sn.

The structure and composition of the modulation doped I region, undoped RT region and the undoped R/E region are shown in Tables II, III and IV, respectively.

TABLE II

| Composition I Region | Doping Concentration (cm$^{-3}$) | Thickness (Å) |
|---|---|---|
| AlInAs | undoped | 5 |
| GaInAs | undoped | 50 |
| AlInAs | undoped | 8 |
| GaInAs | undoped | 48 |

TABLE II-continued

| Composition I Region | Doping Concentration (cm$^{-3}$) | Thickness (Å) |
|---|---|---|
| AlInAs | undoped | 9 |
| GaInAs | undoped | 44 |
| AlInAs | undoped | 10 |
| GaInAs | undoped | 40 |
| AlInAs | undoped | 11 |
| GaInAs | 2.5 × 10$^{17}$ | 36 |
| AlInAs | 2.5 × 10$^{17}$ | 12 |
| GaInAs | 2.5 × 10$^{17}$ | 32 |
| AlInAs | undoped | 12 |
| GaInAs | undoped | 30 |
| AlInAs | undoped | 16 |
| GaInAs | undoped | 30 |

The I region was designed so that the bottom of the miniband 30 was essentially aligned with the upper lasing level 3 in the presence of an appropriate applied electric field. In addition, the thicknesses of at least a first subset of the layers of the I region were varied from layer to layer toward the RT region for the previously described reasons. In this example, the thicknesses of the topmost seven QW layers of the I region SL monotonically decreased from 50 Å to 30 Å toward the RT region (top to bottom of Table II). In addition, the thicknesses of at least a second subset of the barrier layers increased montonically from 5 Å to 16 Å in the same direction.

TABLE III

| Composition RT Region | Doping Concentration (cm$^{-3}$) | Thickness (Å) |
|---|---|---|
| AlInAs (injection barrier) | undoped | 38 |
| GaInAs QW | undoped | 21 |
| AlInAs | undoped | 12 |
| GaInAs QW | undoped | 65 |
| AlInAs | undoped | 12 |
| GaInAs QW | undoped | 53 |
| AlInAs (exit barrier) | undoped | 23 |

In the RT region, the injection barrier served to prevent the wavefunction of the upper lasing level 3 from spreading significantly into the I region and the wavefunction of the ground state g from spreading significantly into the RT region. Similarly, the exit barrier serves the same function with respect to the spread of the wavefunction of the lower lasing level 2 into the R/E region. In general, the exit barrier is thinner than the injection barrier so that electrons do not tend to built up in the lower level 2; i.e., they are efficiently extracted by the R/E region.

TABLE IV

| Composition R/E Region | Doping Concentration (cm$^{-3}$) | Thickness (Å) |
|---|---|---|
| GaInAs | undoped | 40 |
| AlInAs | undoped | 11 |
| GaInAs | undoped | 36 |
| AlInAs | undoped | 12 |
| GaInAs | undoped | 32 |
| AlInAs | undoped | 12 |
| GaInAs | undoped | 30 |
| AlInAs | undoped | 16 |
| GaInAs | undoped | 30 |
| AlInAs | undoped | 10 |

The R/E region was designed so that the upper lasing level 3 was centrally positioned with respect to the minigap 36 for the reasons described previously.

Performance Results

The pulsed light output-current characteristics of a 3.12 mm long and 15 μm wide stripe-laser from sample D2442 are shown in FIG. 4, and the temperature dependence of the threshold current density in its inset. Current pulses of about 50 ns duration and 5.0 kHz repetition rate were used for this measurement. The threshold current density $J_{th}$ was about 25.6 kAcm$^{-2}$ at 10 K in good agreement with the calculation. $J_{th}$ increased with heat sink temperature from ≈25.6 kAcm$^{-2}$ at 10 K to≈31.3 kAcm$^{-2}$ at 110 K. The lasers ceased to operate at temperatures higher than about 120 K. The increase of $J_{th}$ with temperature can be fitted with an exponential function, $J_{th}=J_1 \exp(T/T_1)+J_0$, with $T_1$=31.2 K, $J_1$=25.4 kAcm$^{-2}$, and $J_1$=0.173 kAcm$^{-2}$.

The 120 K operating temperature is not, however, a limitation on the scope of the invention. Higher temperature operation can be attained by improving the gain characteristics of the laser (1) by increasing the current capability of the laser (e.g., by increasing the doping concentration in the I region), or (2) by increasing $z_{32}$ dipole (e.g., by increasing the overlap of the wavefunctions of energy levels 3 and 2.

The voltage applied to this device at laser threshold was ~2.5 V. The major contribution to this value originated in the series resistance of the device (~0.15 Ω, once the designed band-alignment was reached) and in the threshold current (≧12 A).

The peak power, measured with a fast, room temperature HgCdTe-detector, was about 20 mW at 10 K and about 4 mW at 110 K. An average slope efficiency per facet of about 7 mW/A was obtained at low temperatures in reasonable agreement with the expected value of 6.5 mW/A, defined as $(\eta_{coll}/2) \cdot E_{32} \cdot \alpha_m/(\alpha_m 30\ \alpha_w) \cdot (1-\tau_2/\tau_{32})$, where $\eta_{coll}$≈60% is the collection efficiency per facet).

The inset in FIG. 5 shows the characteristic mode-spectrum of a laser from sample D2442. The laser had a Fabry-Perot resonator and was driven in pulsed mode. The center wavelength was about 7.7 μm.

The results of electro-luminescence measurements of our non-cascaded, intersubband laser are also shown in FIG. 5. The luminescence linewidth enters the threshold current density via the gain coefficient, and a narrow linewidth is a much-desired feature. More specifically, FIG. 5 shows electro-luminescence spectra obtained from a circular mesa, spontaneous emission device at various heat sink temperatures and at a current density of about 26.5 kAcm$^{-2}$. At the high energy side the characteristic shape of the emission line can be fitted with a Lorentzian with a dephasing time of ≈0.2 ps at 10 K. The low-energy side of the bell-shaped emission line is significantly broadened. This broadening can be understood from the combination of two effects: the population of electronic states with higher in-plane momentum, which is temperature and current dependent, and the non-parabolic shape of the two electronic subbands involved in the optical transition.

At 10 K and a current density of about 1.75 kAcm$^{-2}$ a full width at half maximum (FWHM) of the emission line of $\Delta E_{FWHM}$≈9 meV was obtained. At the threshold current density (about 25.6 kAcm$^{-2}$) the linewidth was $\Delta E_{FWHM}$≈12 meV. These values agree well with $\Delta E_{FWHM}$≈10 meV obtained from a cascaded (N=30 repeat units) laser structure with a very similar active region and a threshold current density around 1 kAcm$^{-2}$. See, Gmachl et al., supra, and Y. B. Li et al., *Appl. Phys. Lett.*, Vol. 72, No. 17, pp. 2141–2143 (Apr. 27, 1998), which is incorporated herein by reference.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, intersubband sources in accordance with our invention, especially lasers, have a variety of potential uses; for example, in trace gas analysis, environmental monitoring, industrial process control, combustion diagnostics, and medical diagnostics.

What is claimed is:

1. An intersubband semiconductor light source comprising:

a core region including a unipolar radiative transition (RT) region having upper and lower energy levels, an injector-only (I) region disposed on one side of said RT region and a reflector/extractor-only (R/E) region disposed on the other side of said RT region, said I region having a first miniband of energy levels aligned so as to inject electrons into said upper energy level, and said R/E region having a second miniband of energy levels aligned so as to extract electrons from said lower energy level and also having a minigap aligned so as to inhibit the extraction of electrons from said upper level, and electrodes for applying a voltage to said source effective to cause said RT region to generate light at a wavelength determined by the energy difference between said upper and lower energy levels.

2. The invention of claim 1 wherein said core region includes at least two RT regions and at least one injection/relaxation region disposed therebetween, said I region being disposed adjacent one of said RT regions and said R/E region being disposed adjacent another of said RT regions.

3. The invention of claim 1 wherein said I region is designed so that the bottom of said first miniband is essentially aligned with said upper energy level.

4. The invention of claim 1 wherein said R/E region is designed so that the top of said second miniband is essentially aligned with said lower energy level and said upper energy level is centrally aligned with respect to said minigap.

5. The invention of claim 1 wherein said I region comprises a superlattice having a multiplicity of QW (quantum well) layers interleaved with a multiplicity of barrier layers, and wherein the thicknesses of at least a first subset of said QW layers decrease from layer to layer in the direction of said RT region.

6. The invention of claim 5 wherein the thicknesses of at least a second subset of said barrier layers increase from layer to layer in the direction of said RT region.

7. The invention of claim 1 wherein said core region comprises layers of Group III–V compound semiconductors.

8. The invention of claim 7 wherein said core region comprises layers of GaInAs and AlInAs.

9. The invention of claim 1 wherein said light source is a laser.

10. The invention of claim 1 wherein said light source is a spontaneous emission device.

11. An intersubband semiconductor laser comprising:

a core region including a unipolar, undoped radiative transition (RT) region, an injector-only (I) region disposed on one side of said RT region and a reflector-only (R/E) region disposed on the other side of said RT region, said RT region comprising a plurality of GaInAs quantum well (QW) layers interleaved with a AlInAs barrier layers, said QW layers being sufficiently coupled to one another to produce an upper energy level and a lower energy level between which a single lasing transition takes place, said I region having a first miniband of energy levels aligned so as to inject electrons into said upper energy level, and said R/E region having a second miniband of energy levels aligned so as to extract electrons from said lower energy level and also having a minigap aligned so as to inhibit the extraction of electrons from said upper level, said upper energy level being centrally aligned with respect to said minigap, upper and lower cladding regions bounding said core region, an optical cavity resonator, said core region being disposed in said resonator, and electrodes for applying a voltage of less than about 3 V, and for applying current above the lasing threshold, to said laser effective to cause electrons in said RT region to undergo said transition and to generate stimulated emission of light at a wavelength determined by the energy difference between said upper and lower energy levels.

12. The invention of claim 11 wherein said I region comprises a superlattice having a multiplicity of QW layers interleaved with a multiplicity of barrier layers, and wherein the thicknesses of at least a first subset of said QW layers decrease from layer to layer in the direction of said RT region.

13. The invention of claim 12 wherein the thicknesses of at least a second subset of said barrier layers increase from layer to layer in the direction of said RT region.

* * * * *